United States Patent [19]

Hoog et al.

[11] Patent Number: 4,585,920
[45] Date of Patent: Apr. 29, 1986

[54] PLASMA REACTOR REMOVABLE INSERT

[75] Inventors: Josef T. Hoog, Novato; James W. Mitzel, Richmond, both of Calif.

[73] Assignee: Tegal Corporation, Novato, Calif.

[21] Appl. No.: 658,468

[22] Filed: Oct. 9, 1984

Related U.S. Application Data

[63] Continuation of Ser. No. 380,591, May 21, 1982, abandoned.

[51] Int. Cl.$^4$ .................................................. B23K 9/00
[52] U.S. Cl. .................... 219/121 PR; 219/121 PD; 219/121 PG; 156/345
[58] Field of Search ............... 219/121 PD, 121 PE, 219/121 PG, 121 PF, 121 PR, 76.16; 156/646, 643, 345; 204/192 E, 192 N, 164; 373/18-22

[56] References Cited

U.S. PATENT DOCUMENTS

| | | | |
|---|---|---|---|
| 3,408,283 | 10/1968 | Chopra et al. | 373/18 |
| 3,664,942 | 5/1972 | Havas et al. | 219/121 PD |
| 3,940,641 | 2/1976 | Dooley | 219/121 P |
| 4,141,694 | 2/1979 | Camacho | 219/121 P |
| 4,208,159 | 6/1980 | Uehara et al. | 219/121 PG |
| 4,263,088 | 4/1981 | Gorin | 156/643 |
| 4,297,162 | 10/1981 | Mundt et al. | 219/121 PD |
| 4,341,592 | 7/1982 | Shortes et al. | 156/643 |
| 4,342,901 | 8/1982 | Zajac | 219/121 PD |
| 4,367,114 | 1/1983 | Steinberg et al. | 219/121 PD |

Primary Examiner—M. H. Paschall
Attorney, Agent, or Firm—Paul F. Wille

[57] ABSTRACT

An improved plasma reaction chamber is described in which the interior electrode is readily removed. The interior electrode may comprise a variety of materials, including metallized plastic, thus enabling a disposable electrode and a greater variety of plasmas to be used.

21 Claims, 3 Drawing Figures

FIG. 1 — PRIOR ART —

PLASMA REACTOR REMOVABLE INSERT

This application is a continuation, of application Ser. No. 380,591, filed May 21, 1982.

This invention relates to plasma reactor equipment and, in particular, to the construction of a readily assembled and disassembled reactor.

BACKGROUND

In the prior art, plasma reactors come in a variety of shapes, e.g. parallel plate and barrel types, and a variety of capacities, e.g. single wafer and batch. Typically, the reactor comprises a quartz, aluminum, or stainless steel chamber with aluminum electrodes positioned therein. In a recent advance in the art, as described in U.S. Pat. No. 4,209,357, a single wafer, parallel plate reactor is provided with an interior or upper plasma electrode which serves both as an RF (radio frequency) electrode and as a gas manifold. While providing increased uniformity and other advantages, the reactor is expensive to make due to the precise machining and alignment of the various parts which make up the electrode/manifold.

The processes run in plasma reactors have become more complex and use a variety of gases. As is known, a plasma contains the source gas or gases as well as intermediate products and by-products. Sometimes a successful process is obtained by only slight shifts in the chemical balance in the reactor. A problem exists in that the chemicals used or found in a process can chemically attack the materials used to make the chamber. Another problem is that the chamber, particularly the electrodes, is subject to physical attack by the plasma, e.g. what is known as back sputtering. Yet another problem is that certain materials react to form coatings on parts of the chamber, particularly the electrodes. These three problems combine for a fourth wherein subsequent operations, particularly with different chemicals, cause deposits or materials from the chamber to deposit on the semiconductor wafer therein, contaminating it, or to upset the chemical balance of the reaction.

These problems can be minimized by careful choice of materials and reagents, as well as routine cleaning of the chamber. This makes ease of assembly and disassembly an important feature of a reactor, both for cleaning and for changing at least the electrode materials.

In view of the foregoing, it is therefore an object of the present invention to provide an improved plasma reactor which is more easily assembled and disassembled.

Another object of the present invention is to provide a plasma reactor having readily removable electrodes.

A further object of the present invention is to provide a plasma reactor having interchangeable electrodes of different materials, with one set being chosen for a particular process.

Another object of the present invention is to provide a plasma reactor having electrodes coated with a material resistant to the plasma reaction.

A further object of the present invention is to provide a plasma reactor having electrodes coated with a material intended to contribute to the plasma reaction.

Another object of the present invention is to provide a plasma reactor having interchangeable electrodes of the same material for reducing the downtime associated with cleaning the reactor.

A further object of the present invention is to provide an improved plasma reactor having an electrode/manifold member of simplified construction.

SUMMARY

The foregoing objects are achieved in the present invention wherein a plasma reactor comprises a shell attached to a frame wherein the shell comprises passageways and a plenum for gas. The interior of the shell defines a broad, shallow counterbore. An electrode member abuts the shoulder around the counterbore, thereby defining a second plenum. The electrode member comprises a plurality of apertures in the central portion thereof for gas flow in a first direction and a second plurality of apertures in a peripheral portion thereof for gas flow in a second direction. The electrode member may comprise metallic and/or non-metallic materials. The electrode member is held in place by retaining ring means which attaches to the shell by suitable fastening means. The lower electrode of the reactor is part of the closure mechanism for the chamber and receives the semiconductor wafer or other article to be treated. The fastening means are readily accessible when the reactor is open yet are outside the sealed volume when the reactor is closed.

A more complete understanding of the present invention can be obtained by considering the following detailed description in conjunction with the accompanying drawings, in which.

Figure 1:
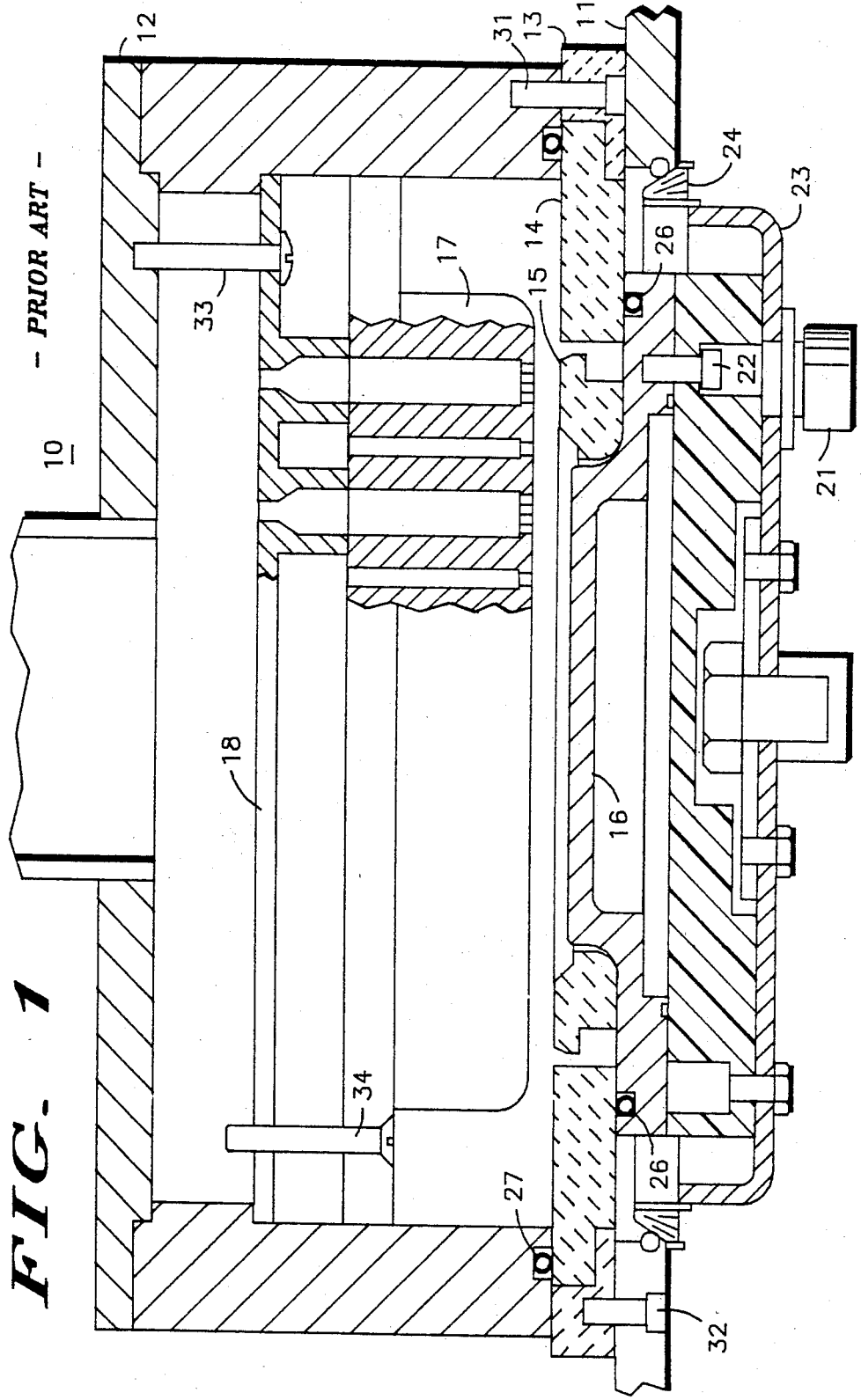
FIG. 1 illustrates a plasma reactor in accordance with the prior art.

FIG. 1 illustrates, in slightly more detail, the construction of the plasma reactor described in U.S. Pat. No. 4,209,357. Specifically, reactor 10 comprises a frame 11 to which is fastened chamber body 12, retaining ring 13, and isolation ring 14. Wafer ring 15, which typically comprises a ceramic, sits atop lower electrode 16 which forms the closure mechanism for the reactor. Lower electrode 16 is RF hot and receives the RF energy from connector 21 and attachment bolt 22. RF connector 21 comprises a coaxial cable, the outer portion of which is connected to RF shield 23. Frame 11 comprises an enlarged bore through which the lower electrode assembly passes. Interconnecting RF shield 23 and frame 11 are a plurality of conductive fingers 24, suitably disposed about the interior of the bore in frame 11. RF shield 23 is isolated from lower electrode 16 by isolation disc 25. A suitable seal, such as O-ring 26, seals lower electrode 16 to isolation ring 14, thereby sealing the enclosed volume of the reactor. Within the reactor volume, the interior or upper electrode assembly comprises an upper electrode 17 and a manifold plate 18.

In assembling a reactor constructed as illustrated in FIG. 1, manifold plate 18 is fastened to chamber body 12 by fasteners 33 suitably positioned around the periphery thereof. Similarly, upper electrode 17 is fastened to manifold plate 18 by another plurality of fastening means such as bolt 34. Isolation ring 14 is temporarily held in place while retaining ring 13 is secured to chamber body 12 by another plurality of fastening means such as bolt 31. The thus completed chamber assembly is then fastened to a frame 11 by way of another plurality of bolts 32. Typically, eight or more bolts are used for each plurality.

Manifold plate 18 is rarely flat after being attached to chamber body 12. The machining of the plurality of apertures and channels in manifold plate 18 causes distortions thereof. Further, improper torque on bolts 33 which attach plate 18 to chamber 12 may cause further distortions in plate 18. In assembling the reactor illustrated in FIG. 1 the torque applied to bolts 33 and 34 are used to correct for any non-planarities in electrode 17, which must be planar and uniformly spaced from lower electrode 16. Also, the passageways in upper electrode 17 and manifold plate 18 must be carefully aligned.

As can be appreciated from the foregoing, the reactor of FIG. 1, while providing improvements over prior art reactors, is difficult to disassemble, clean, and reassemble quickly. Further, the metal to metal contact between upper electrode 17 and manifold plate 18 must be carefully maintained across the entire area of contact to prevent leakage or mixing or supply and exhaust gases. Further, the reduced diameter portion of upper electrode 17, which provides clearance for bolts 34, causes a plasma region which is not as well defined as desired due to the large volume around the sides of upper electrode 17. Also, during disassembly of reactor 10 virtually all seals for the chamber must be broken, not only large seals 26 and 27 but also the plurality of smaller seals associated with the reactor such as the water and gas seals. It is particularly smaller seals, which are not intended to be made and broken repeatedly, that may cause difficulty in operating the reactor.

Figure 2:
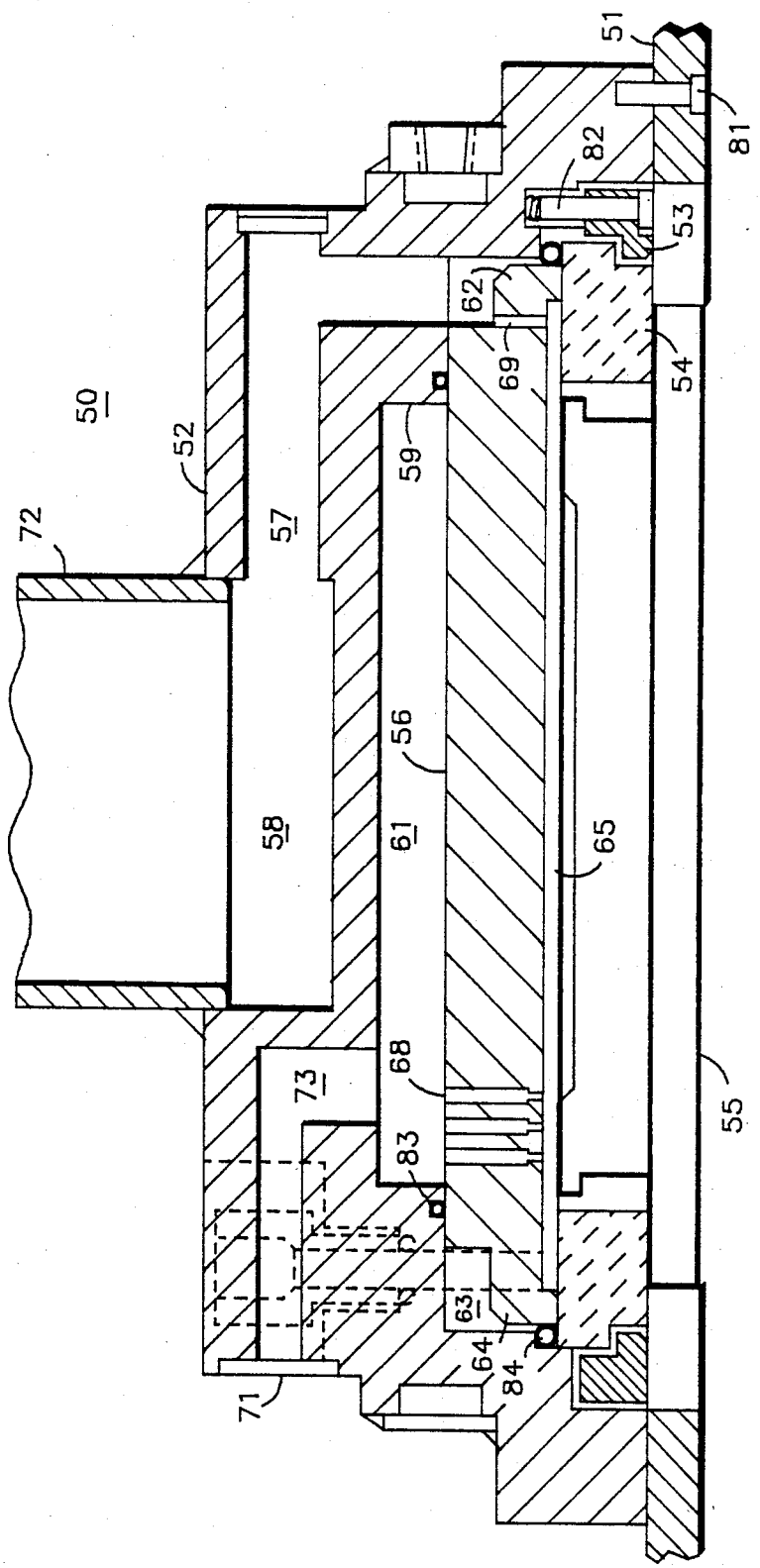
FIG. 2 illustrates a preferred embodiment of a plasma reactor in accordance with the present invention.

These disadvantages are overcome with the reactor illustrated in FIG. 2. Specifically, reactor 50 comprises a frame 51 to which chamber body or shell 52 is attached by a plurality of fastening means such as bolt 81. Typically, depending upon the diameter of the shell, eight to twelve bolts would be used to fasten shell 52 to frame 51. Within shell 52, a plurality of passageways 57 communicate with a central plenum 58 through which gases are typically exhausted by member 72 which is connected to a suitable vacuum pump. Also, within shell 52 is passageway 73 which communicates to the outside of shell 52 by way of connection fitting 71. A source of one or more gases is connected to fitting 71. Alternatively, a plurality of passageways 73 can be provided so that the interior of shell 52 acts as the mixing chamber. Shell 52 forms a broad, shallow counterbore having shoulders 59.

Upper electrode 56 is abutted against shoulders 59 to form plenum 61 within chamber 52. The electrode is plain, i.e. characterized by the absence of any means for fastening it, e.g. enlarged bores for bolts, threaded portions or the like. Electrode 56 must be held in place by another, appropriately shaped member which is adapted for being fastened to shell 52. As illustrated in FIG. 2, isolation ring 54 holds electrode 56 in place and retaining ring 53 is attached to shell 52, fastening both electrode 56 and isolation ring 54.

Upper electrode 56 comprises a plurality of bores such as bores 68 which communicate from one major surface of electrodes 56 to the other in a predetermined pattern across the central area of electrode 56. The lower surface of electrode 56, in turn, preferably comprises a large shallow counterbore defined as annular shoulder 64 which determines the spacing between the major surface of electrode 56 and lower electrode assembly 55. Lower electrode assembly 55 is not shown in detail as its construction can be similar to the construction of the lower electrode assembly described in FIG. 1. When the reactor is closed, i.e. when electrode assembly 55 is positioned as shown, chamber 65 is formed above lower electrode assembly and is the volume in which the plasma is formed.

Around the peripheral portion of electrode 56 is formed a plurality of bores 69 which communicates with passageways 57. In a preferred embodiment of the present invention, the pheriphery of electrode 56 is of reduced thickness to form an annular chamber 63 between shoulder 62 and shell 52. Annular chamber 63 communicates by way of passageway 57 with plenum 58. In so doing, it is not necessary to align bores 69 with corresponding portions of passageways 57, thereby consideralby simplifying the construction of a plasma reactor in accordance with the present invention.

Reactor 50 is readily disassembled by opening the chamber, and removing bolts 82, of which there are typically eight. Retaining ring 53 is removed and isolation ring 54 is removed. This done, electrode 56 is then simply removed and the disassembly process is completed. Thus, it is not necessary to remove shell 52 from frame 51 nor is it necessary to break the plurality of seals for vacuum, gas, and water lines. O-ring seals 83 and 84 are intended for opening and closing and, even if worn, are readily replaced. Further, there is no metal to metal seal as in the chamber of the prior art. In addition, fastening members 82 are all outside the seal formed by O-ring 84 and thus can comprise any suitable material for fastening members, since they are not subject to attack by the plasma.

Thus it is apparent to those of skill in the art that the construction of chamber 50 is considerably simplified from that of the prior art, not only in the number of fasteners used but also in their location. Further, the construction of the electrode is simplified and the sealing of the chamber is also simplified. In addition, the seals for vacuum, gas, and water lines need not be broken each time the reactor is disassembled, thereby increasing the reliability of each of those joints. Also, the upper electrode has a greater area in contact with the shell, thereby improving the heat sinking of the elctrode and increasing the temperature control of the electrode.

Electrode 56 may comprise any suitable material and may readily be interchanged with other electrodes of the same outline, for example, to vary the spacing between electrode 56 and lower electrode assembly 55. This is readily accomplished by changing the depth of the counterbore, i.e. the height of shoulder 64. Further, electrode 56 may comprise any suitable material appropriate for the particular reaction taking place. For example, the most commonly used material is aluminum. However, materials such as anodized aluminum or stainless steel can also be used. In addition, electrode 56 can have the lower major surface thereof coated with a suitable material to either enhance the plasma reaction or to help electrode 56 withstand the plasma within chamber 65.

Figure 3:
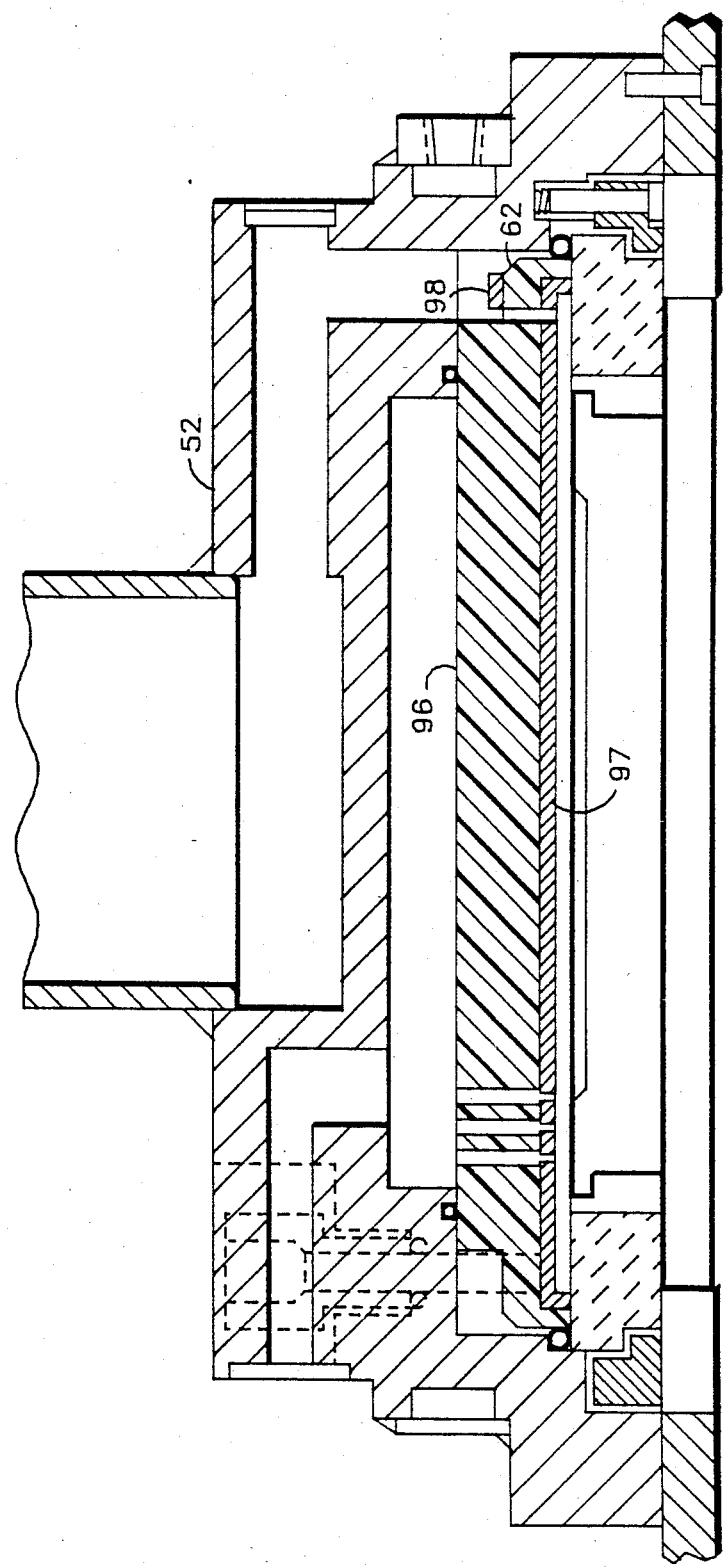
FIG. 3 illustrates an alternative embodiment of a plasma reactor in accordance with the present invention.

Alternatively, as illustrated in FIG. 3, electrode 96 may comprise a non-metallic member having a metal coating 97 formed thereon. In this case, it is necessary for metal layer 97 to be electrically connected with shell 52. This can be accomplished a number of ways, such as forming a conductive layer 98 on the upper portion of shoulder 62 for engaging a suitable contact (not shown) connected to a nearby portion of shell 52. Conductive layers 97 and 98 are readily connected by a conductor in one or more of bores 69. In so doing, one obtains a plasma electrode which is much less expensive to produce and can be disposed of rather than cleaned, if desired. As an example, but not by way of limitation, electrode 96 may comprise acetal plastic (Delrin), polyterafluoroethylene plastic (Teflon), or cermaic, e.g. alumina, having a coating of aluminum formed thereon.

There is thus provided by the present invention an improved plasma reactor which is substantially simpler to construct and maintain and, in addition, enables one to interchange electrodes to obtain the most compatible materials for the particular process being accomplished.

Having thus described the invention it will be apparent to those of skill in the art that various modifications may be made within the spirit and scope of the present invention. For example, while illustrated in a preferred embodiment as a single wafer, parallel plate reactor for processing semiconductor wafers, it is understood that any article or plurality of articles may be processed in a reactor in accordance with the present invention.

We claim:

1. Planar RF plasma reactor apparatus comprising:
   a frame member having an aperture therein;
   a shell secured to said frame about said aperture;
   an upper electrode which fits within said shell, at least a portion of said electrode being electrically coupled to said shell;
   retaining means attached to said shell for holding said electrode in place; and
   wherein said aperture is larger than said electrode in at least one dimension for enbaling removal of said electrode through said aperture without separating said shell and said frame.

2. The aparatus of claim 1 wherein said electrode comprises metal.

3. The apparatus of claim 2 wherein said electrode is coated with a non-metallic layer on at least the major surface exposed to plasma.

4. The apparatus of claim 3 wherein said non-metallic layer comprises glass.

5. The apparatus of claim 3 wherein said non-metallic layer comprises a polymer.

6. The apparatus of claim 1 wherein said electrode comprises a non-metallic material coated with a metallic layer on at least the major surface exposed to plasma.

7. The apparatus of claim 6 wherein said electrode comprises a ceramic.

8. The apparatus of claim 6 wherein said electrode comprises a polymer.

9. The apparatus of claim 1 wherein
   said shell defines a first plenum having a plurality of passageways communicating therewith and defines a counterbore having a shoulder portion, wherein said electrode rests on and is located within said shell by said shoulder;
   and wherein said counterbore and said electrode defines a second plenum.

10. The apparatus as set forth in claim 9 wherein said electrode comprises a plurality of through-bores in the central portion thereof for communicating with said second plenum.

11. The apparatus as set forth in claim 10 wherein said electrode comprises a second plurality of through-bores about the periphery thereof for communicating with said passageway.

12. The apparatus as set forth in claim 11 wherein said electrode comprises a reduced thickness portion about the periphery thereof to define an annular chamber between said reduced thickness portion and said shell, said annular chamber interconnecting said passageway and said second plurality of through-bores.

13. The apparatus as set forth in claim 9 wherein said shoulder portion includes sealing means for engaging a major surface of said electrode thereby sealing said second plenum.

14. The apparatus as set forth in claim 13 wherein said retaining means comprises:
   a first ring of electrially non-conductive material for electrically isolating said electrode;
   a second ring, larger in diameter than said first ring and having a plurality of holes therethrough; and
   fastening means passing through said holes for attaching said second ring to said shell.

15. The apparatus as set forth in claim 14 wherein said frame comprises clearance means for access to said fastening means without separating said shell from said frame.

16. The apparatus as set forth in claim 15 wherein said shell includes second sealing means for engaging said electrode and said first ring, whereby said fastening means are outside the seal therebetween.

17. The plasma reactor apparatus as set forth in claim 1 and further comprising:
   non-metallic sealing means between said retaining means and said shell.

18. An easily removed electrode for a planar RF plasma reactor comprising:
   a plain electrode member having a first and second major surfaces;
   said member defining a first and a second plurality of bores;
   said first plurality of bores extending from one major surface to the other, in a predetermined pattern in the central portion of said members, for gas flow in a first direction;
   a reduced thikcness portion about the periphery of said member; and
   said second pluraltiy of bores being disposed about the periphery of said member in said reduced thickness portion for gas flow in a second direction.

19. The electrode as set forth in claim 18 wherein said second plurality of bores extend through said reduced thickness portion.

20. The electrode as set forth in claim 19 wherein said second plurality of bores are distributed uniformly.

21. An electrode as set forth in claim 18 wherein said first plurality of bores comprise a reduced diameter portion at the exit end thereof.

* * * * *